US007208329B2

(12) United States Patent
Fukatsu et al.

(10) Patent No.: US 7,208,329 B2
(45) Date of Patent: Apr. 24, 2007

(54) CONNECTOR

(75) Inventors: Yukihiro Fukatsu, Yokkaichi (JP); Toshikazu Sakurai, Yokkaichi (JP); Satoshi Suda, Wako (JP); Yoshiaki Kida, Wako (JP); Masaru Shinmura, Wako (JP)

(73) Assignees: Sumitomo Wiring Systems, Ltd. (JP); Honda Motor Co., Ltd. (JP)

( * ) Notice: Subject to any disclaimer, the term of this patent is extended or adjusted under 35 U.S.C. 154(b) by 239 days.

(21) Appl. No.: 10/865,353

(22) Filed: Jun. 10, 2004

(65) Prior Publication Data

US 2004/0253882 A1 Dec. 16, 2004

(30) Foreign Application Priority Data

Jun. 11, 2003 (JP) ............................ 2003-166519

(51) Int. Cl.
*H01L 21/66* (2006.01)

(52) U.S. Cl. ........................................ 438/14; 439/572

(58) Field of Classification Search ................ 439/752, 439/595, 487, 752.5, 598; 438/11, 14, 18
See application file for complete search history.

(56) References Cited

U.S. PATENT DOCUMENTS

| | | | | | |
|---|---|---|---|---|---|
| 4,973,268 | A | * | 11/1990 | Smith et al. | 439/595 |
| 5,061,210 | A | * | 10/1991 | Jinno | 439/752 |
| 5,378,176 | A | | 1/1995 | Sasai | 439/752 |
| 5,562,500 | A | * | 10/1996 | Tsukakoshi | 439/752 |
| 5,651,703 | A | * | 7/1997 | Sasai | 439/752 |
| 6,019,645 | A | * | 2/2000 | Avery et al. | 439/752 |
| 6,139,375 | A | * | 10/2000 | Konoya et al. | 439/752 |
| 6,645,015 | B2 | * | 11/2003 | Mase et al. | 439/752 |
| 6,702,627 | B2 | * | 3/2004 | Nankou et al. | 439/752 |

* cited by examiner

*Primary Examiner*—Matthew Smith
*Assistant Examiner*—Khiem Nguyen
(74) *Attorney, Agent, or Firm*—Gerald E. Hespos; Anthony J. Casella

(57) ABSTRACT

In a side plate (52) of a retainer (50), a jig insertion groove (70) is cut at an upper end portion of its front edge. A releasing jig (J) is insertable into a gap between the bottom surface of the jig insertion groove (70) and a vertical front edge of a recessed surface (27) of a female housing (20). If the releasing jig (J) is rotated so as to be pried, the retainer (50) is pushed back diagonally downward along a guide groove (60) and reaches a temporary retaining position.

10 Claims, 12 Drawing Sheets

CONNECTOR

BACKGROUND OF THE INVENTION

1. Field of the Invention

The present invention relates to a connector having a retainer for double retention.

2. Description of the Related Art

Conventionally, a so-called side retainer type connector is known in which a retainer fitting opening is provided in a side surface, e.g., a bottom surface, of a connector housing, and a retainer is pressed into this opening to retain terminal fittings. In this type of connectors, a connector is known in which the retainer is pressed in diagonally (e.g., refer to U.S. Pat. No. 5,378,176).

Specifically, this connector is arranged as follows: A plurality of cavities are formed in the connector housing in such a manner as to be juxtaposed in the widthwise direction, and a retainer having a pair of side plates on both sides of a bottom plate having retaining portions for retaining terminal fittings is fitted to a retainer fitting opening formed in the bottom surface of the connector housing in communication with each cavity. The retainer is fitted in such a manner as to be capable of advancing and retracting from the diagonally rearward direction while clamping the connector housing in the widthwise direction.

The retainer is held in advance at a temporary retaining position where the retaining portions are retracted from the cavities. In this state, the terminal fittings are inserted in the respective cavities from behind. When the terminal fittings are inserted by a proper amount, the terminal fittings are primarily retained resiliently by lances. Subsequently, the retainer is pressed in to a final retaining position, and the retaining portions retain the terminal fittings while advancing into the cavities, thereby doubly preventing the terminal fittings from coming off.

In particular, with the type in which the retainer is pressed in diagonally, there is an advantage in that, in a case where there has been a terminal fitting which has not been inserted by the proper amount, i.e., which has been semi-inserted, the terminal fitting can be made to reach a predetermined position as the retaining portion pushes the terminal fitting in the process in which the retainer is pressed in.

Meanwhile, in a case where the terminal fittings are removed from the connector housing for the purpose of maintenance or the like, after the retainer is returned from the final retaining position to the temporary retaining position by using a jig, the terminal fitting is pulled out from the cavity while flexurally displacing the lance in the retention canceling direction by another jig.

Conventionally, the structure of a portion for returning the retainer to the temporary retaining position is constructed as follows. As shown in FIG. 14, a pair of jig insertion grooves 3, into which a slotted screwdriver-shaped jig J can be inserted, are respectively cut in both end portions on a front edge side of a bottom plate 2 of a retainer 1. As the jig J is inserted in the jig insertion groove 3 and is rotated in the direction of the arrow, the retainer 1 is moved diagonally rearward while the final retention lock is being canceled, thereby returning to the temporary retaining position.

As the type in which the retainer 1 moves in the diagonal direction, when the retainer 1 has returned to the temporary retaining position, as shown by the chain lines in the drawing, a gap s is unintentionally formed between front edges of the bottom plate 2 of the retainer 1 and a retainer fitting opening 5 formed in a connector housing 4. As a result, terminal fittings 6 inserted in the cavities are in an exposed state. Therefore, if the jig J falls into the gap 3 by being dislocated from the jig insertion groove 3 owing to its slippage or the like, the jig J can possibly come into contact with an adjacent terminal fitting 6 as well, resulting in a short circuit.

The invention has been completed to overcome the above-described drawback.

SUMMARY OF THE INVENTION

According to one aspect of the invention, there is provided a connector including: a connector housing; a plurality of cavities disposed in the connector housing to be juxtaposed in a widthwise direction; a plurality of terminal fittings each inserted in the cavities respectively from behind of the cavities; a plurality of lances disposed in the cavities respectively and primarily retains the terminal fittings resiliently; a retainer fitting opening formed in an outer surface of the connector housing in communication with each of the cavities; and a retainer having a pair of side plates on both sides of a base portion having retaining portions that retains the terminal fittings, the retainer fitted to the retainer fitting opening in such a manner so as to be capable of advancing and retracting from a diagonally rearward direction while clamping the connector housing in the widthwise direction, wherein the retainer is to be held respectively at a temporary retaining position at which the retaining portion is retracted from the cavity to allow the insertion and withdrawal of the terminal fitting and at a final retaining position at which the retaining portion is advanced in the cavity to doubly retain a corresponding one of the terminal fittings, wherein the connector further comprising a jig insertion portion provided in each of the side plates of the retainer and allows a jig to be inserted therein, wherein the retainer is operatable to return from the final retaining position to the temporary retaining position as the jig is rotated along a planar direction of the side plate.

BRIEF DESCRIPTION OF THE DRAWINGS

The objects and advantages of the present invention will become more apparent by describing a preferred embodiment thereof in detail with reference to the accompanying drawings, wherein.

DETAILED DESCRIPTION OF THE PREFERRED EMBODIMENTS

Figure 1:
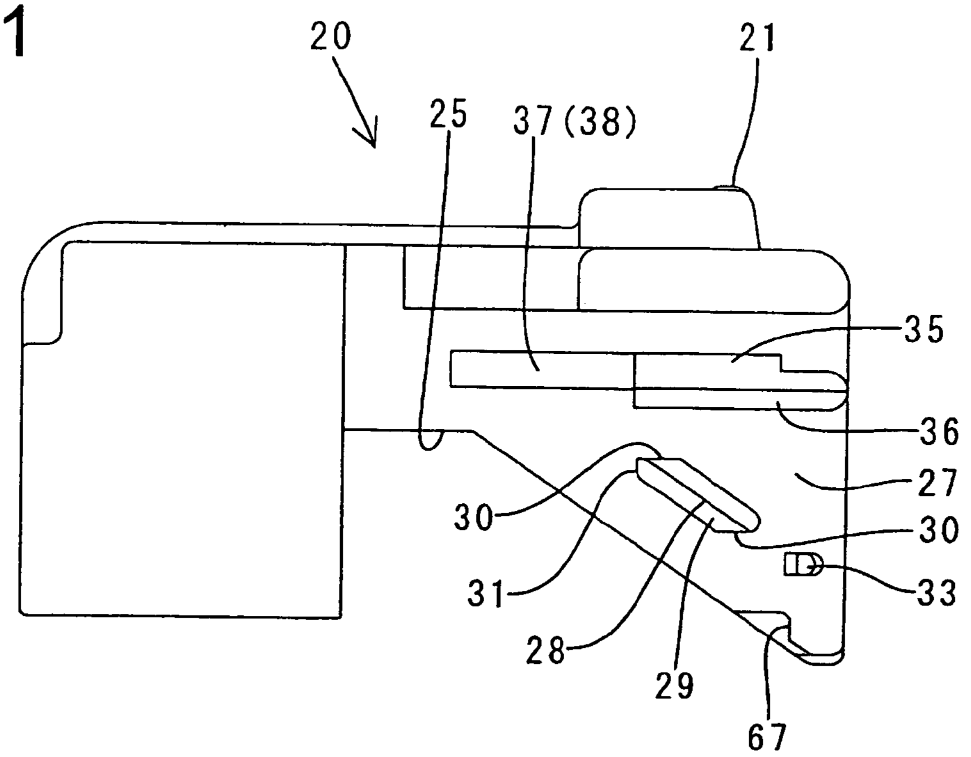
FIG. 1 is a side elevational view of a female housing in accordance with an embodiment of the invention.

Referring now to the accompanying drawings, a description will be given in detail of a preferred embodiment of the invention.

In the embodiment, a female connector is illustrated by way of example, and is generally comprised of a female connector housing 20 (which will be hereafter referred to as the female housing), female terminals 10 accommodated therein, and a retainer 50 for doubly preventing the female terminals 10 from coming off.

It should be noted that a description will be given hereafter by assuming that the left side of the drawing is the front side.

First, the female terminal 10 will be described with reference to FIG. 9. The female terminal 10 is formed by bending a metal plate blanked into a predetermined developed shape, and a square tubular connecting portion 11 is provided on its front side, a tab of an unillustrated mating male terminal being adapted to enter the connecting portion 11 to allow connection. As a barrel 12 provided on its rear side is crimped, the female terminal 10 is secured to a terminal of an electric wire W.

At a widthwise central position on a lower surface of the connecting portion 11 of the female terminal 10, a front projection 13, which can be retained by a lance 23 which will be described later, is formed by beating. Meanwhile, at a widthwise central position on a rear end of that lower surface, a rear projection 14, which can be retained by the retainer 50, is similarly formed by beating. It should be noted that a stabilizer 15 whose functions include, among others, the prevention of reverse insertion is formed uprightly on one side surface slightly forwardly of this reverse projection 14.

The female housing 20 is made of a synthetic resin, and is formed in a transversely wide flat block shape as a whole, as shown in FIGS. 1 to 4. A lock arm 21 for locking the unillustrated mating male terminal in a fitted state is formed on an upper surface of the female housing 20.

A plurality of cavities 22 oriented in a back-and-forth direction are formed in the female housing 20 in such a manner as to be juxtaposed in the widthwise direction, and are provided in two upper and lower stages. The above-described female terminal 10 is inserted into each cavity 22 from behind and can be accommodated therein, and the lance 23 for temporarily retaining the female terminal 10 is provided on a front side of its bottom surface. The lance 23 extends forwardly in a cantilevered manner, and its distal end side is vertically deflectable. As the female terminal 10 passes over the lance 23, the lance 23 is downwardly deflected, and returns after the passage to retain the front projection 13 formed on the female terminal 10, thereby functioning so as to prevent the female terminal 10 from coming off.

A retainer fitting opening 25 for fitting the retainer 50 is formed in a lower surface of the female housing 20 (on the opposite surface to the surface where the lock arm is provided). More particularly, the retainer fitting opening 25 is formed in such a way as to extend over three regions including the lower surface and the left and right side surfaces of the female housing 20, i.e., the retainer fitting opening 25 has a form in which it is open to the three sides.

Figure 2:
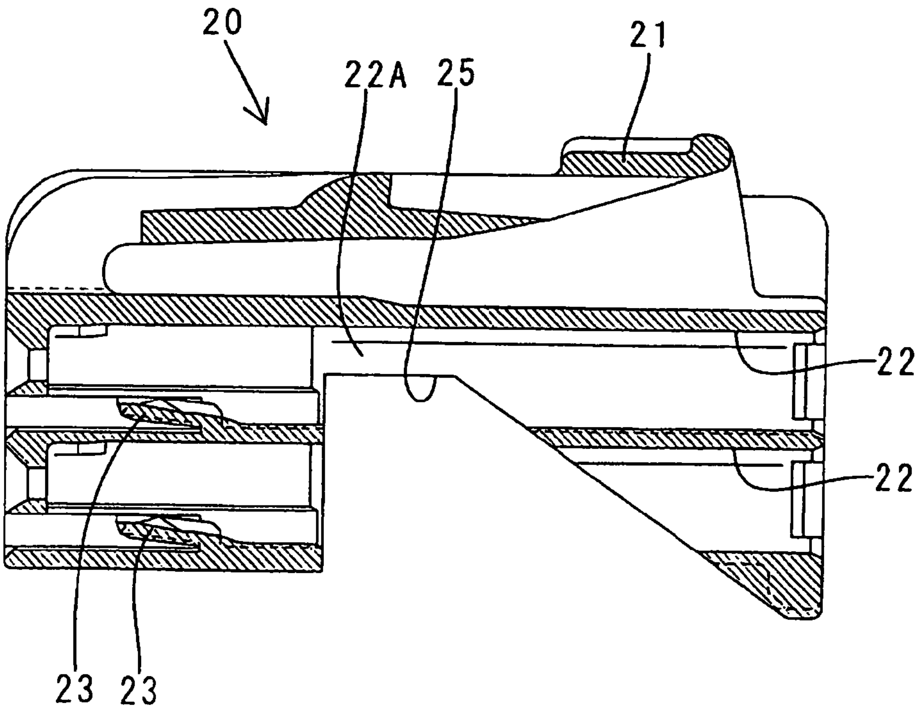
FIG. 2 is a side cross sectional view thereof.
Figure 3:
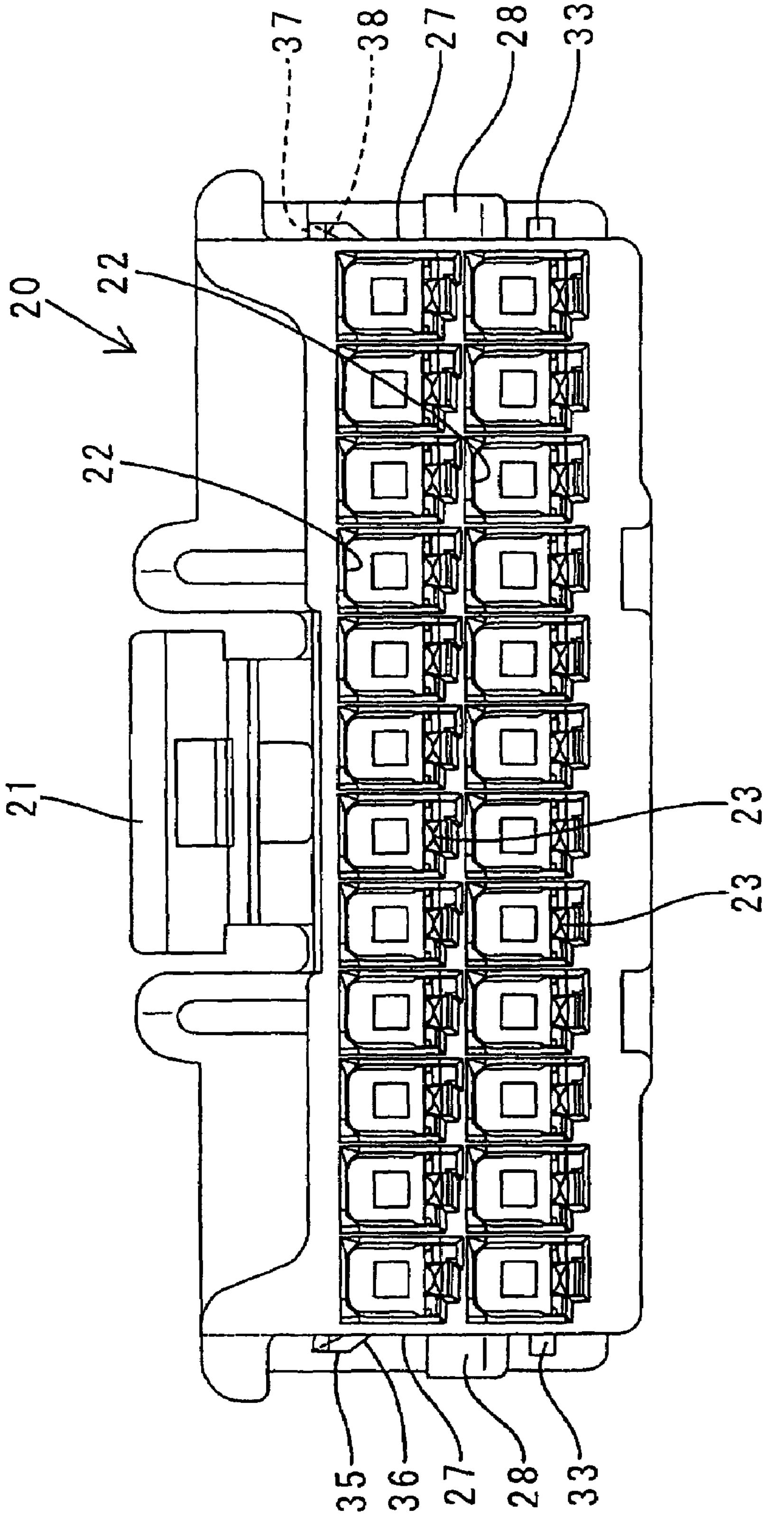
FIG. 3 is a rear view thereof.
Figure 4:
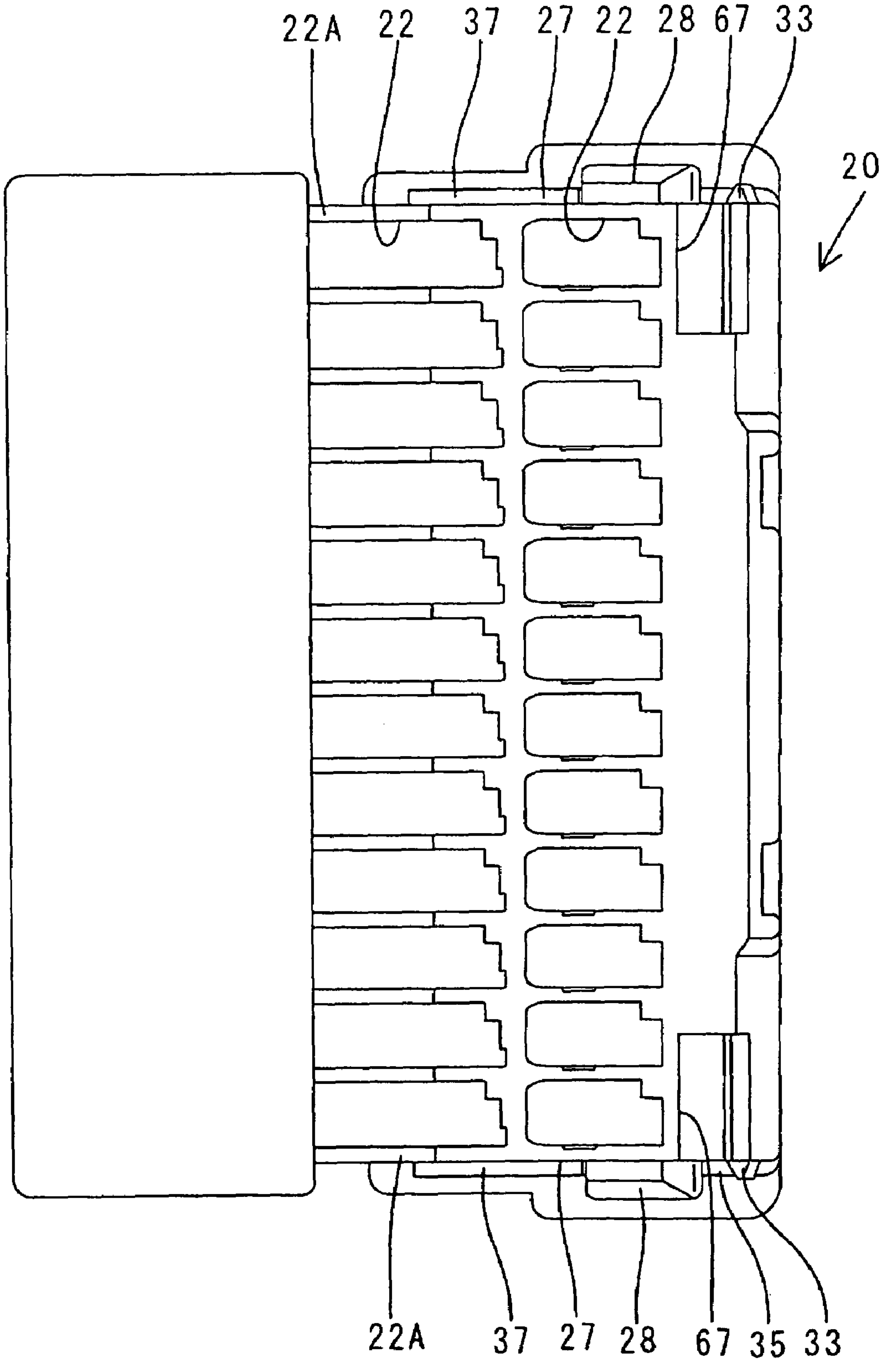
FIG. 4 is a bottom view thereof.

In addition, the retainer fitting opening 25 is formed with such a depth as to expose the interior of each cavity 22 located in the upper stage. More particularly, as shown in FIG. 2, the ceiling surface of the retainer fitting opening 25 is located at a substantially heightwise central position of the upper-stage cavities 22. As a result, the lower-stage cavities 22 are divided into front and rear portions over their entire heights, while the upper-stage cavities 22 are divided into front and rear portions at their heightwise lower half portions. At these divided portions, the form becomes such that partition walls 22A for partitioning the laterally adjacent cavities 22 are also removed.

Further, as for the portion notched by the retainer fitting opening 25 in the interior of the female housing 20, a front surface side is formed such that all the opening edges of each cavity 22 rises vertically, while a rear surface side is formed with such an inclination that the opening edges of each cavity 22 slope downward from the front side toward the rear side in the direction in which the female terminal 10 is inserted.

On each of left and right side surfaces of the female housing 20, an area located upwardly and rearwardly of each side opening of the retainer fitting opening 25 is formed as a recessed surface 27 which is recessed one step from a forward area, as shown in FIG. 1. A rib-shaped retaining projection 28 is formed on this recessed surface 27 in such a manner as to extend along the inclined edge of the retainer fitting opening 25. The principal function of this retaining projection 28 is to stabilize the pressed attitude of the retainer 50 when the retainer 50 is pressed into and fitted to the female housing 20. On the outer surface of the retaining projection 28, a chamfer 29 is provided on the entire lower side (the side close to the retainer fitting opening 25) with a longitudinal center line set as a boundary, so as to allow the operation of fitting the retainer 50 to a guide groove 60 (see FIG. 6) in the retainer 50 to be effected smoothly. Horizontal surfaces 30 are respectively formed on both upper and lower end faces of the retaining projection 28, and a vertical surface 31 continuing to the horizontal surface 30 is also formed at the upper end face.

A pressing-in restricting projection 33 is formed on a lower line of extension of the retaining projection 28. When the retainer 50 is at a temporary retaining position (see FIG. 8), this pressing-in restricting projection 33 retains a lower end of the guide groove 60 in the retainer 50, to thereby restrict the retainer 50 from being erroneously pressed in to a final retaining position.

A jouncing restricting portion 35 for suppressing jouncing when the retainer 50 is at the final retaining position (see FIG. 10) is provided projectingly on the recessed surface 27 at a position higher than the retaining projection 28. The jouncing restricting portion 35 is formed in such a form as to extend substantially horizontally along the back-and-forth direction. Meanwhile, a tapered surface 36 is provided over the entire lower edge of the jouncing restricting portion 35.

In addition, a catch 37 is projectingly provided forwardly of the jouncing restricting portion 35. This catch 37 is formed such that its upper edge continues to an upper edge of the jouncing restricting portion 35. The arrangement provided is such that when the retainer 50 has reached the final retaining position, the catch 37 is retained by a retaining pawl 65 (see FIG. 7) of the retainer 50 to thereby restrict the retainer 50 from coming off downward. However, as shown in the drawing, a front surface of the catch 37 is formed as a tapered surface 38 sloping upward to allow the riding operation of the retaining pawl 65 to be effected smoothly.

Figure 5:
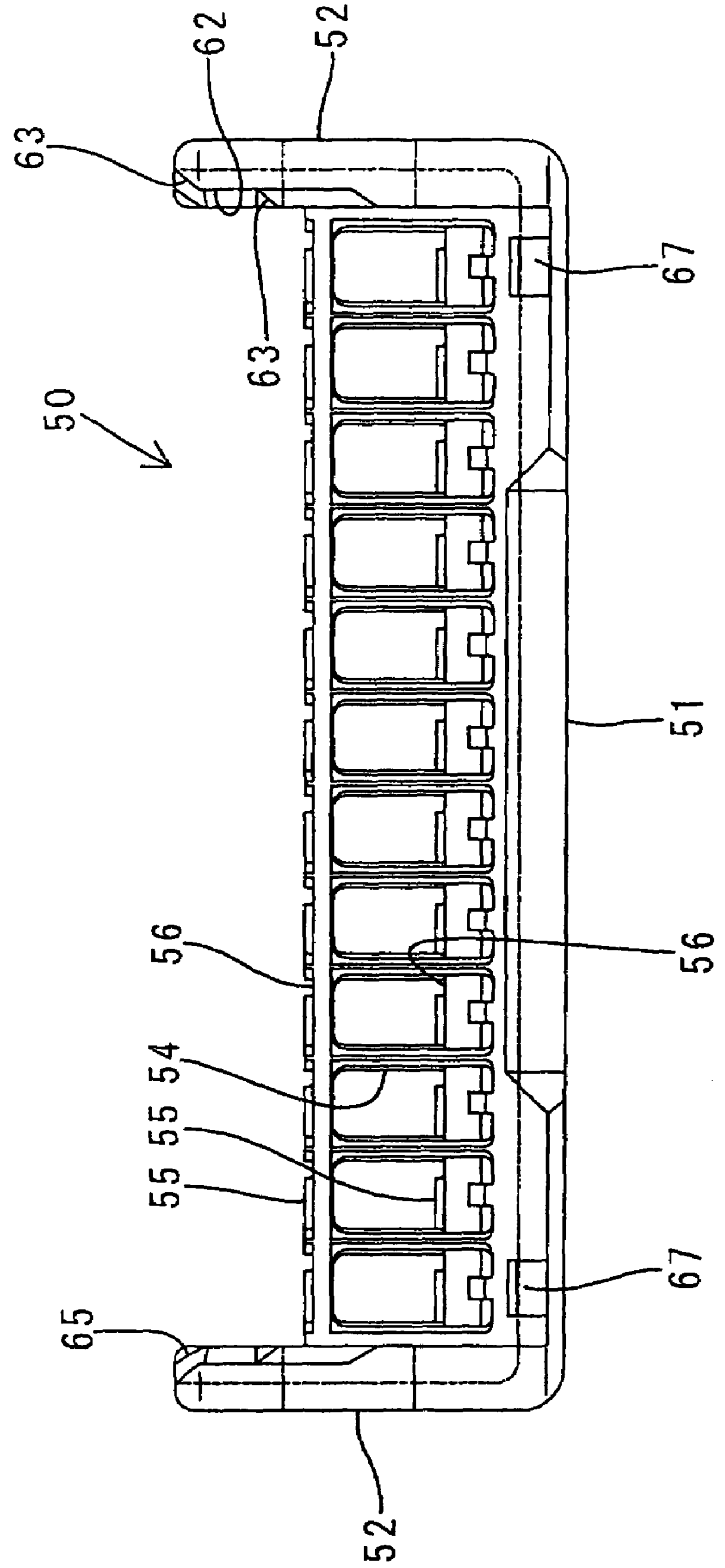
FIG. 5 is a rear view of a retainer.
Figure 6:
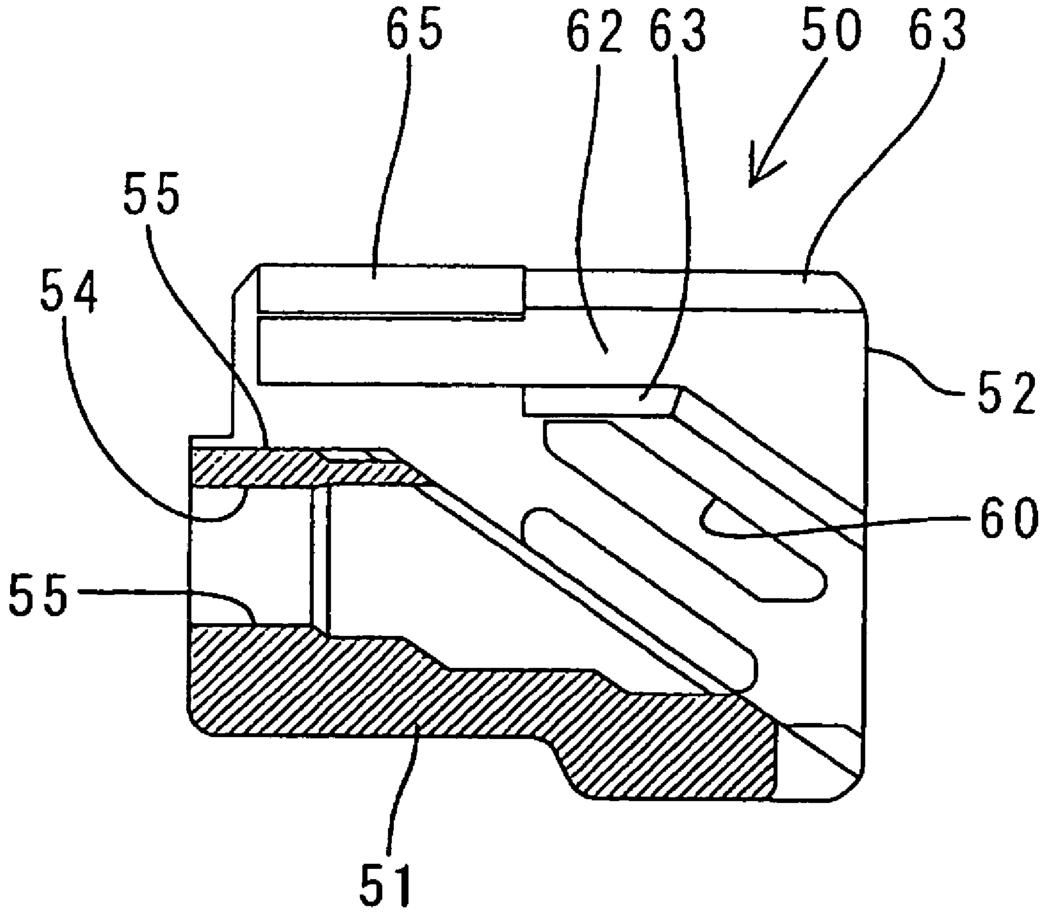
FIG. 6 is a side cross sectional view thereof.
Figure 7:
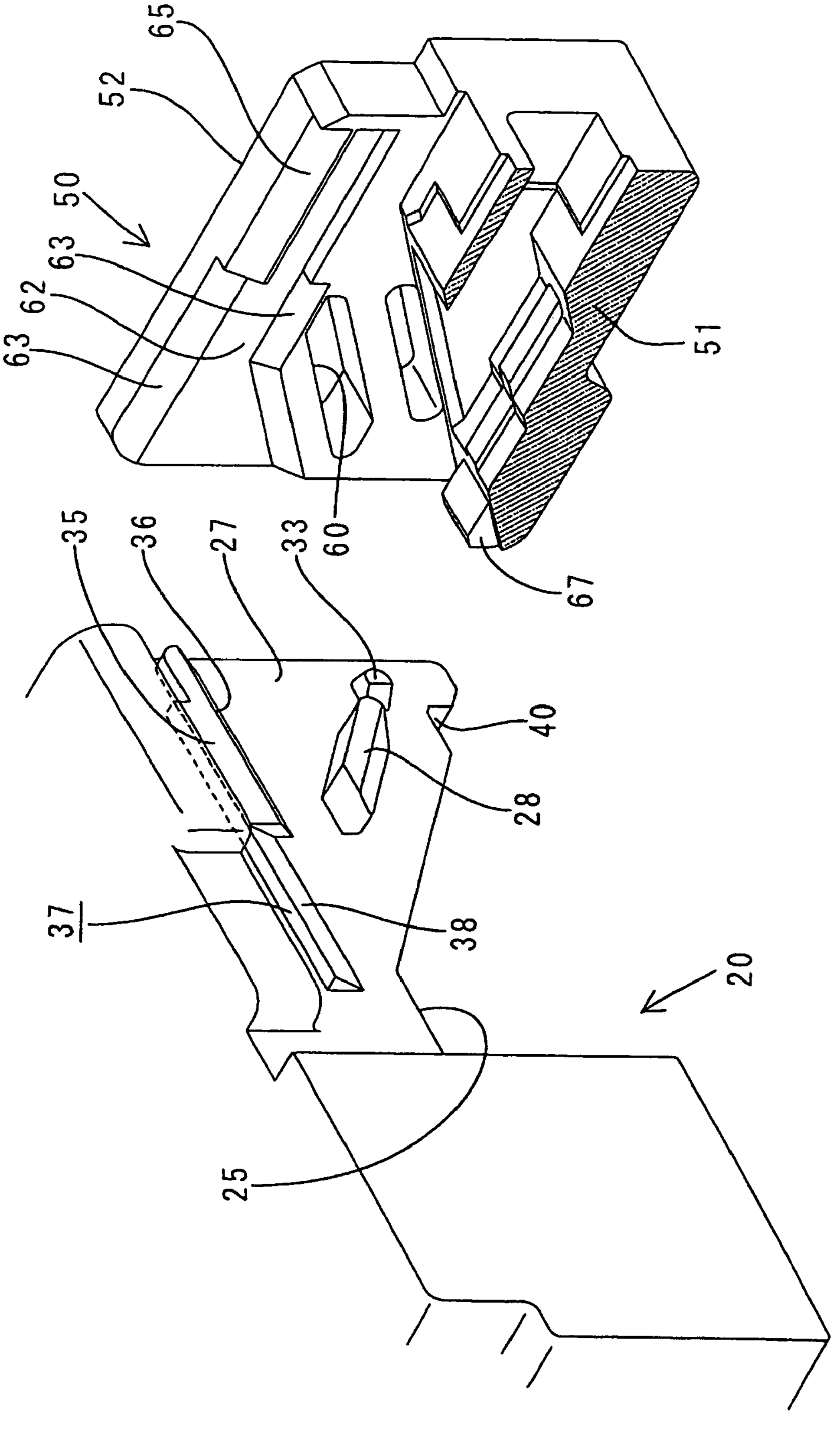
FIG. 7 is a partial exploded perspective view of the female housing and the retainer.

Next, a description will be given of the retainer 50. The retainer 50 is formed of a synthetic resin material in the same way as the female housing 20. As shown in FIGS. 5 to 7, the retainer 50 includes a base portion 51 which is mated with and fitted to the retainer fitting opening 25, as well as a pair of side plates 52 formed in such a manner as to respectively jut out from transverse end portions of this base portion 51.

As shown in FIG. 5, window frames 54 are formed in the base portion 51 in the same number as that of the cavities in each stage of the female housing 20. Each window frame 54 is formed so as to be matable with each cavity 22 in the lower stage. Also, as shown in FIG. 6, a front surface-side opening edge of each window frame 54 is formed in such a manner as to rise vertically so as to mate with the front surface-side opening edge of each cavity 22 divided into front and rear portions by the retainer fitting opening 25. Meanwhile, a rear surface-side opening edge of each window frame 54 is formed with an inclination which matches with the inclination of the rear surface-side opening edge of each divided cavity 22.

Retaining portions 55, which are respectively capable of retaining rear surfaces of the rear projections 14 of the female terminals 10, are formed on a front end portion of the lower surface of each window frame 54 and on an upper surface portion of the base portion 51. It should be noted that a portion located rearwardly of the retaining portion 55 in the lower stage is recessed to allow the female terminal 10 to escape.

Figure 9:
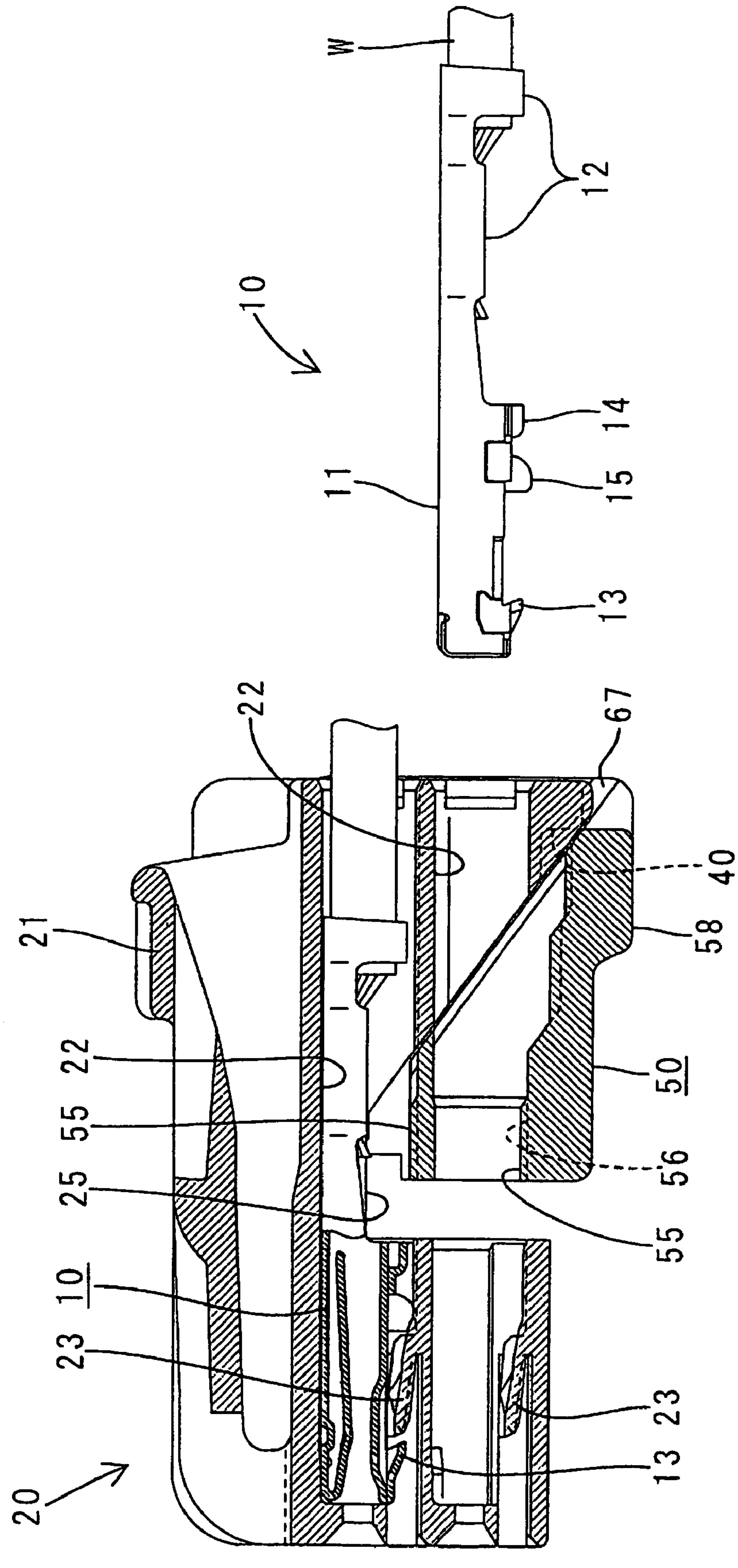
FIG. 9 is a side cross sectional view illustrating the retainer at the temporary retaining position.
Figure 11:
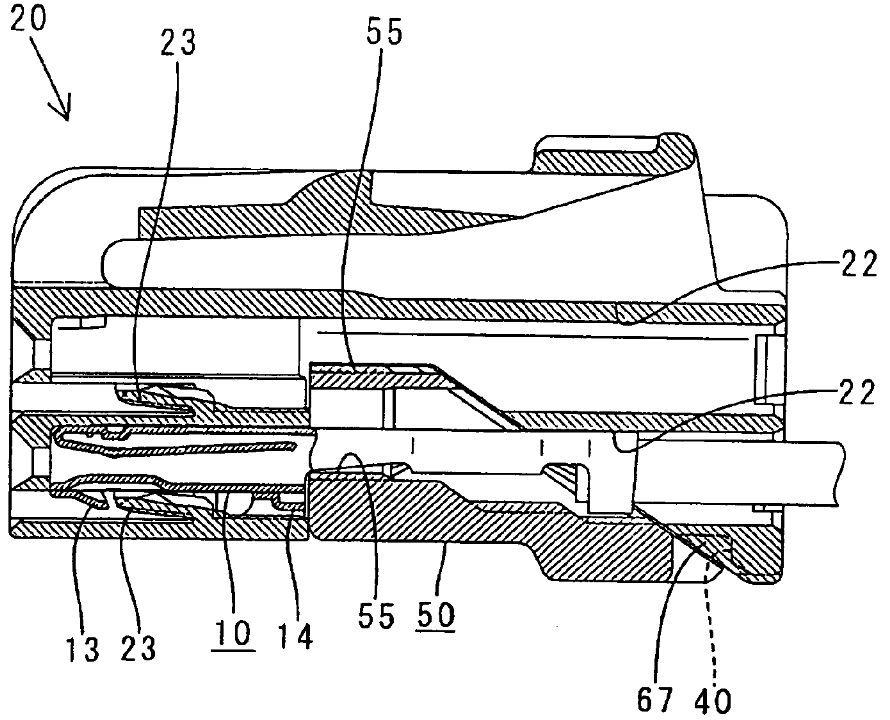
FIG. 11 is a side cross sectional view thereof.

When the retainer 50 is at the temporary retaining position, as shown in FIG. 9, the upper and lower retaining portions 55 are each adapted to retreat to substantially the same height as that of the bottom surface of the corresponding cavity 22, thereby permitting the insertion and withdrawal of each female terminal 10. Meanwhile, when the retainer 50 has moved to the final retaining position, as shown in FIG. 11, each retaining portion 55 enters the corresponding cavity 22 from below and is thereby capable of retaining the rear projection 14 of the female terminal 10.

In addition, a stabilizer passage groove 56 for allowing the passage of the stabilizer 15 of the female terminal 10 is recessed in each retaining portion 55.

Both side plates 52 of the retainer 50 are disposed at such an interval to straddle and clamp both side surfaces of the female housing 20, and are expandably deformable. Each side plate 52 is formed with such a size as to be capable of closing the side opening of the retainer fitting opening 25 and opposing a predetermined range of the recessed surface 27 when the retainer 50 has reached the final retaining position. Further, the side plate 52 is formed with substantially the same thickness as the depth of the recessed surface 27. When the retainer 50 is at the final retaining position, the side plate 52 is substantially flush with the outer side surface of the female housing 20, i.e., also serves as an outer wall of the side surface portion in the female housing 2.

An operating portion having a large wall thickness is formed on an outer surface on the rear portion side of each side plate 52 in such a manner as to be oriented vertically, and its lower end portion is formed so as to project from a lower surface of the base portion 51.

The guide groove 60 is penetratingly formed in an area of the side plate 52 where the operating portion 58 is formed. The guide groove 60 is formed with a gradient extending along the inclination of the rear surface side of each window frame 54, i.e., with the same gradient as that of the inclination of the opening edge on the rear surface side of each cavity 22 in the female housing 20. The guide groove 60 is formed with substantially the same groove width as the short side width of the aforementioned retaining projection 28, and its both end portions are formed so as to match the shapes of both end portions of the retaining projection 28.

Figure 8:
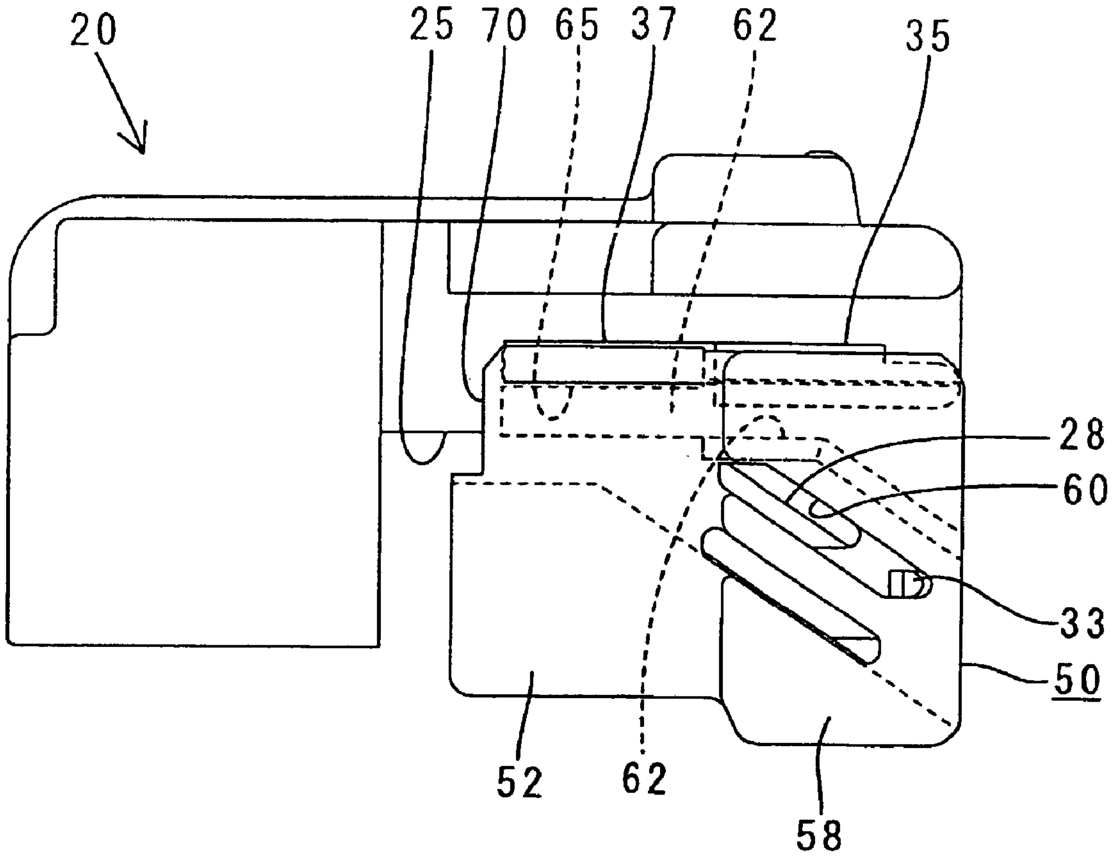
FIG. 8 is a side elevational view of a state in which the retainer is at a temporary retaining position.
Figure 10:
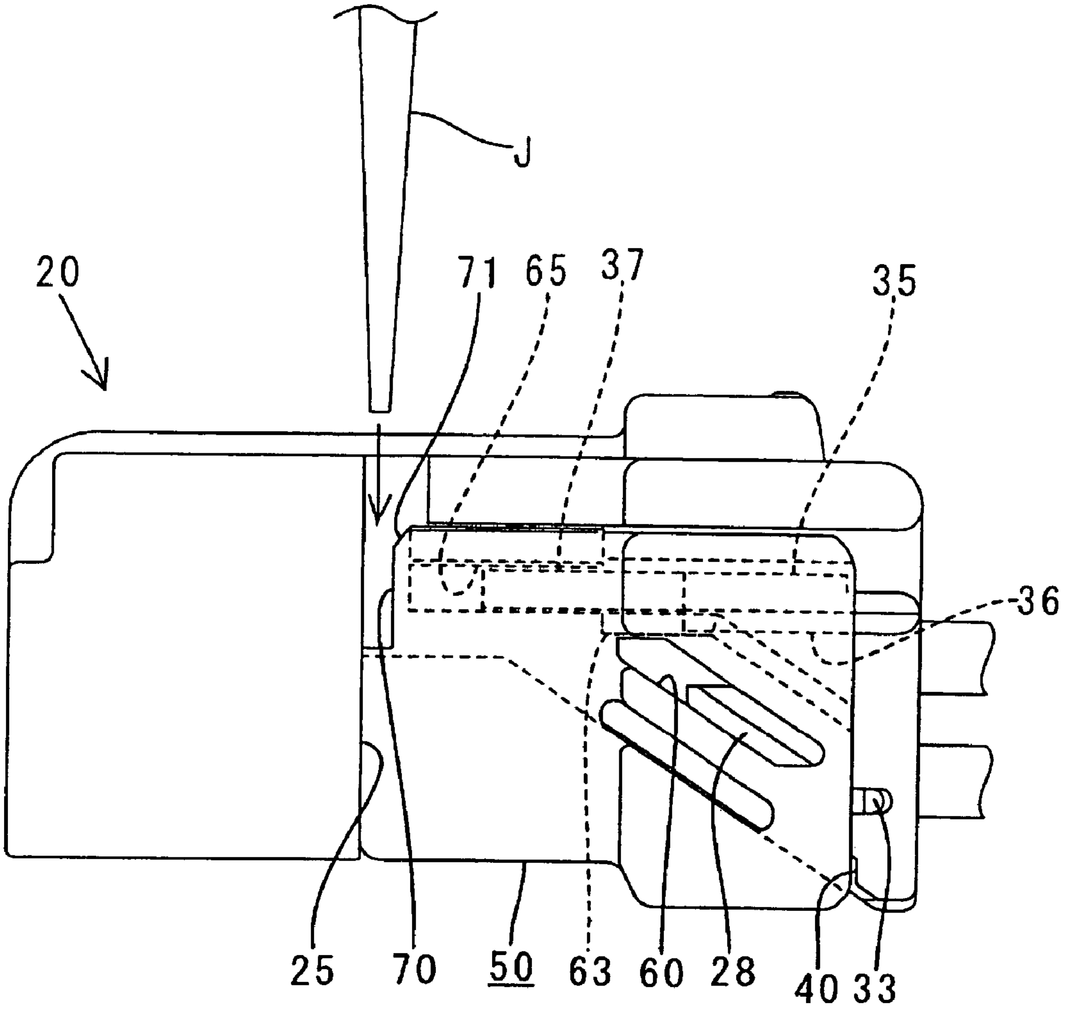
FIG. 10 is a side elevational view of a state in which the retainer is at a final retaining position.

As shown in FIG. 8, as for the guide groove 60, both the retaining projection 28 and the pressing-in restricting projection 33 can be fitted to its both ends. In such a state, the retainer 50 is arranged to be held at the temporary retaining position. At the time the retainer 50 is moved from the temporary retaining position to the final retaining position, the guide groove 60 is caused to ride across the pressing-in restricting projection 33 in order to cause the pressing-in restricting projection 33 to exit from the guide groove 60. In the meantime, both side plates 52 are expandably deformed. However, the retaining projection 28 has a large amount of projection as compared with the pressing-in restricting projection 33, and its allowance of retention is set with a sufficient height to allow the state of retention of the guide groove 60 to continue even by the expandable deformation of the side plate 52. Thus, as shown in FIG. 10, as the retaining projection 28 moves to the lower end side of the guide groove 60, the retainer 50 is set in the state of final retention.

A restricting recess 62, into which the aforementioned jouncing restricting portion 35 can be fitted, is formed in the inner surface of each side plate 52 at a position higher than the guide groove 60, and tapered surfaces 63 are respectively formed at its both upper and lower edges. With respect to the longitudinal direction, the restricting recess 62 is recessed over a range extending from a substantially central portion to a rear end of each side plate 52. With respect to the heightwise direction, the restricting recess 62 is formed over a range extending from an upper end portion of the guide groove 60 to an upper edge of the side plate 52. It should be noted that the lower tapered surface 63 is formed with a downward gradient on its rear end side.

Further, when the retainer 50 is at the temporary retaining position, as shown in FIG. 8, an upper edge of the jouncing restricting portion 35 is held at a heightwise position substantially aligned with an upper edge of the restricting recess 62, and a predetermined interval is kept with a lower edge of the restricting recess 62. In addition, when the retainer 50 is at the final retaining position, as shown in FIG. 10, the tapered surface 36 at the lower edge of the jouncing restricting portion 35 is mated with and abuts against the tapered surface 63 of the restricting recess 62, thereby making it possible to restrict the upward jouncing.

The restricting recess 62 extends further forward to enlarge its recess area, but the retaining pawl 65 is formed at its upper edge portion. When the retainer 50 is at the temporary retaining position, this retaining pawl 65 is in a face-to-face relation with the catch 37 on the female housing 20 side at substantially the same heightwise position (see FIG. 8). However, when the retainer 50 has moved to the final retaining position, the retaining pawl 65 rides across the tapered surface 38 of the catch 37 and is retained at an upper edge of the catch 37, to thereby prevent the retainer 50 from coming off downward.

Figure 12:
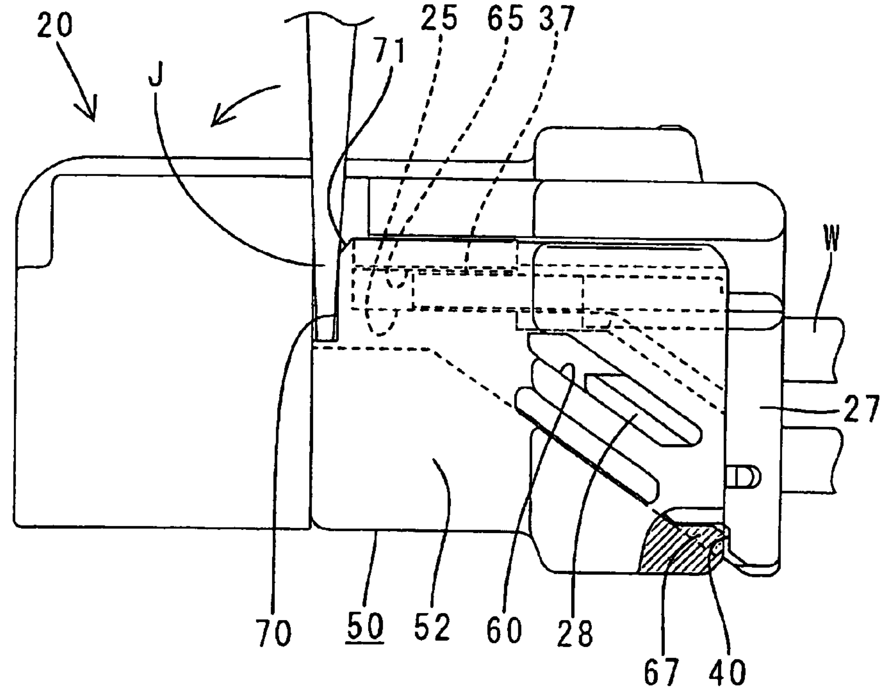
FIG. 12 is a partially cutaway side elevational view explaining the returning operation of the retainer.

In addition, as shown in FIGS. 7 and 12, on an inclined rear surface of the base portion 51 of the retainer 50, a pair of locking projections 67 are respectively formed at its both transverse end portions. This locking projection 67 is formed such that its upper surface is horizontal and its rear surface is vertical, and its corner is formed as a chamfered surface. Meanwhile, on an inclined surface of the retainer fitting opening 25 in the female housing 20, a locking hole 40, to which the aforementioned locking projection 67 can be fitted, is formed at each of transverse end portions on a lower edge side thereof. This locking hole 40 is also formed such that a ceiling of the locking hole 40 is disposed to be horizontal and its innermost surface is vertical.

When the retainer 50 is at the temporary retaining position, as shown in FIG. 9, the locking projection 67 is on standby diagonally below the rear side of the locking hole 40. When the retainer 50 has moved to the final retaining position, as shown in FIG. 12, the locking projection 67 is fitted in the locking hole 40 to thereby prevent the retainer 50 from coming off mainly in the rearward direction. The retainer 50 is held at the final retaining position as a result of this engagement in conjunction with the engagement between the catch 37 and the retaining pawl 65 mentioned above.

On the other hand, as for the retainer 50, a returning operation is carried out by means of a releasing jig J from the final retaining position toward the temporary retaining position. The releasing jig J is made of a metal, and is formed substantially in the shape of a tapered slotted screwdriver, as shown in FIG. 10.

Further, in the side plate 52 of the retainer 50, a jig insertion groove 70 is cut at an upper end portion of its front edge. The arrangement provided is such that the releasing jig J is insertable from above into the gap between the bottom surface of the jig insertion groove 70 and the vertical front edge of the recessed surface 27 of the female housing 20. An entrance corner portion of the jig insertion groove 70 is provided with a chamfer 71 for a guiding purpose.

Hereafter, a description will be given of the operation in accordance with the embodiment.

In assembly, the retainer 50 is first held at the temporary retaining position with respect to the female housing 20. The retainer 50 is pressed in in such a manner as to clamp both recessed surfaces 27 of the female housing 20 while expanding its both side plates 52, and both the retaining projection 28 and the pressing-in restricting projection 33 are fitted into each guide groove 60, as shown in FIG. 8. As the retaining projection 28 and the pressing-in restricting projection 33 are respectively retained at both ends of each guide groove 60, the retainer 50 is set in the state of being held at the temporary retaining position. At this temporary retaining position, as shown in FIG. 9, the upper and lower retaining portions 55 of the retainer 50 remain retreated below the corresponding cavities 22.

In this state, the female terminal 10 is inserted from behind into each cavity 22. The female terminal 10 passes through the retainer 50, and is pressed in while flexurally displacing the lance 23 downwardly. When the front projection 13 exceeds the tip of the lance 23, the lance is returned to cause its tip to be retained by the front projection 13, and is thereby subjected to the so-called primary retention.

Upon completion of the insertion of the female terminals 10 into all the cavities 22, the operating portions 58 are picked, and the retainer 50 at the temporary retaining position is pressed in toward the final retaining position. Then, a lower end portion and its vicinities of the guide groove 60 are deformed so as to ride across the pressing-in restricting projection 33, so that the pressing-in restricting projection 33 exits from the guide groove 60. At the same time, the retainer 50 is subjected to the guiding action due to the fitting of the retaining projection 28 and the guide groove 60, and is pushed in diagonally upward.

Then, when the retainer 50 reaches the final retaining position, inside the female housing 20, as shown in FIG. 11, the upper and lower retaining portions 55 enter the cavities 22 from below, and retain rear surface sides of the rear projections 14 of the corresponding female terminals 10, which, together with the lances 23, doubly prevents the female terminals 10 from coming off.

At this final retaining position, as shown in FIG. 10, as the retaining pawl 65 rides across the tapered surface 38 and is retained at the upper edge of the catch 37, the downward coming off is prevented. In addition, as shown in FIG. 12, as the locking projection 67 is fitted to the locking hole 40, the rearward coming off is prevented, thereby locking the retainer 50 at the final retaining position. Also, as the lower edge of the jouncing restricting portion 35 abuts against the lower edge of the restricting recess 62, the upward jouncing of the retainer 50 is restricted.

It should be noted that even in a state in which the female terminal 10 has not been retained by the lance 23 due to the lack of the insertion depth of the female terminal 10, i.e., in the state in which the female terminal 10 is in a semi-inserted state, the retaining portion 55 presses the rear projection 14 of the female terminal 10 in the process in which the retainer 50 advances diagonally. Hence, the female terminal 10 can be automatically corrected up to the proper position. Meanwhile, in a case where the inserted position of the female terminal 10 is shallower than the aforementioned semi-inserted state, even if an attempt is made to push in the retainer 50, the retaining portion 55 interferes with the lower surface of the connecting portion 11 of the female terminal 10, thereby restricting further pushing-in. As a result, the operator is able to ascertain that the female terminal 10 is at a position farther from the proper depth of insertion.

Figure 13:
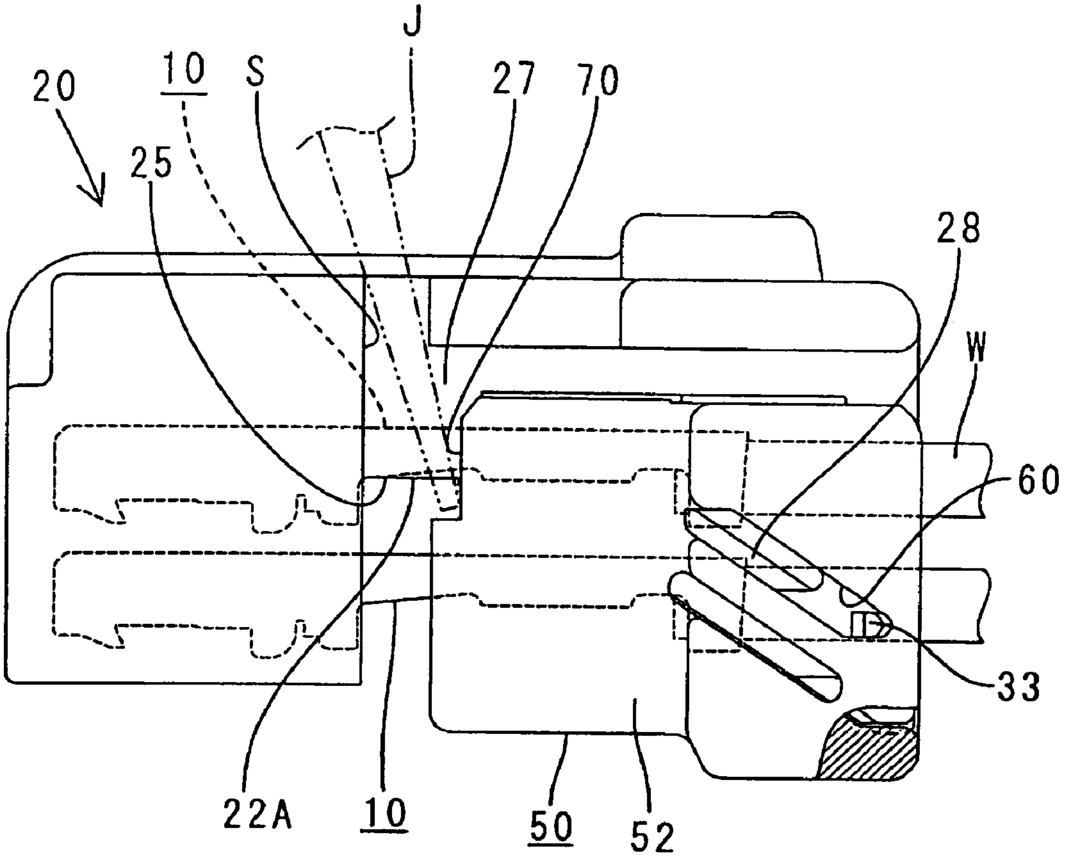
FIG. 13 is a partially cutaway side elevational view of a state in which the retainer has been returned to the temporary retaining position.
Figure 14:
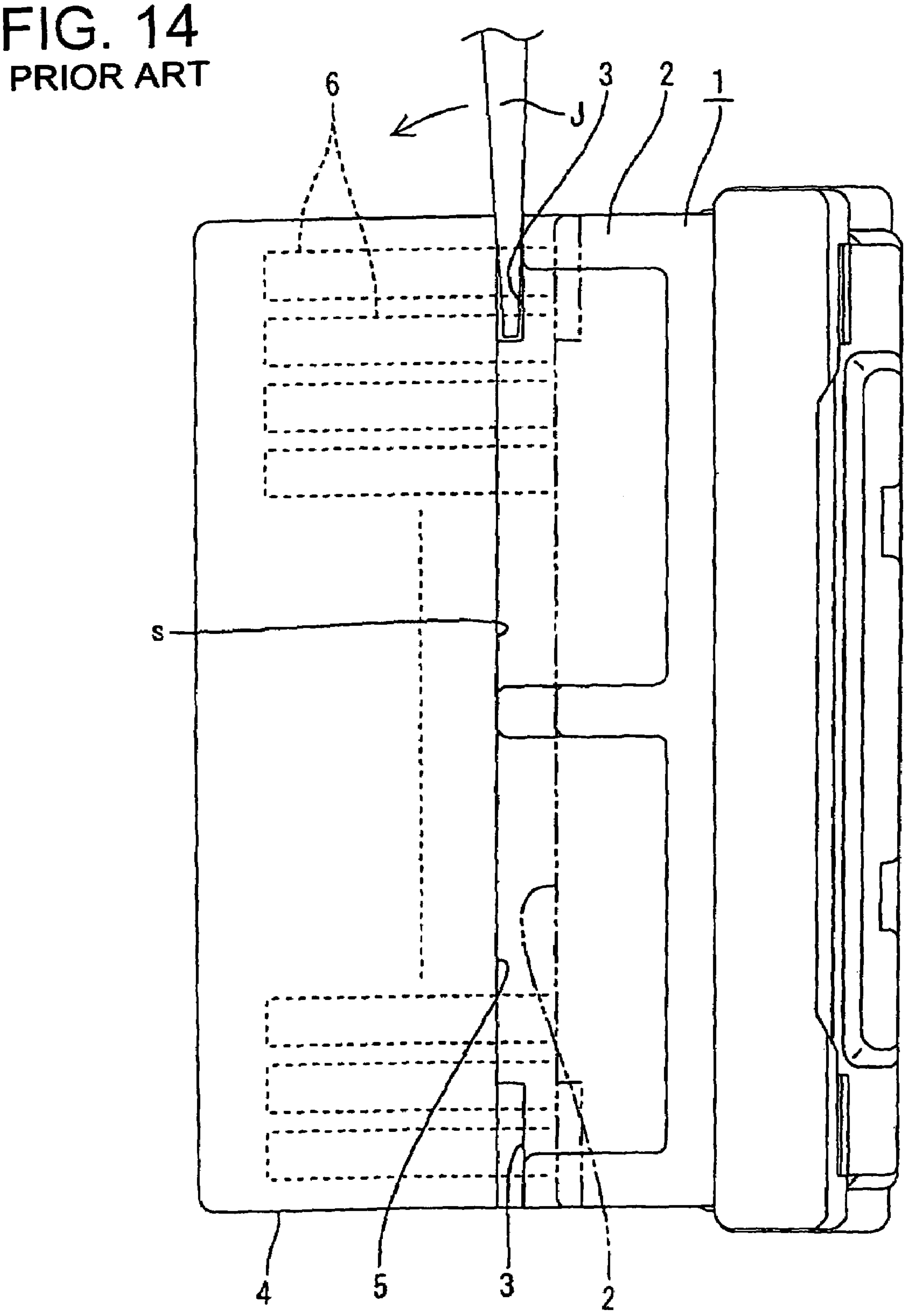
FIG. 14 PRIOR ART
FIG. 14 is a bottom view of a conventional example.

On the other hand, in a case where the female terminals 10 are removed from the female housing 20 for the purpose of maintenance or the like, the operation is carried out as follows. First, after the female housing 20 is removed from the mating male housing, the tip of the releasing jig J is inserted into the jig insertion groove 70, as indicated by an arrow in FIG. 10. Subsequently, if the tip of the releasing jig J is rotated in the direction of an arrow in FIG. 12 so as to be pried, the side edge of the jig insertion groove 70 is pressed rearwardly (rightwardly in the drawing). As a result, the retainer 50 is pushed back diagonally downward in such a way as to follow the guide groove 60. Concurrently, each retaining pawl 65 rides over the catch 37 while the side plates 52 are being expanded, and the locking projection 67 is disengaged from the locking hole 40. Finally, as shown in FIG. 13, if the pressing-in restriction projection 33 is retained again in the guide groove 60, the retainer 50 returns to and is held at the temporary retaining position. Then, if the operation of releasing the lance 23 is effected from the front side of the female housing 20 by using another jig, the female terminal 10 can be drawn out from the cavity rearwardly by pulling the wire W.

Here, when the retainer 50 has been returned to the temporary retaining position, as shown in FIG. 13, a relatively large gap S is formed between the front edge of the retainer 50 and the front edge of the retainer fitting opening 25. Accordingly, there is a possibility of the releasing jig j falling into the gap S. For instance, since the lower-stage female terminals 10 are bare and exposed in a juxtaposed manner in the gap formed on the lower surface side, if the releasing jig J falls into the gap S from the lower surface side, the releasing jig J possibly comes into contact with the juxtaposed female terminals 10 simultaneously, thereby resulting in a short circuit.

In this respect, in the embodiment, since the jig insertion groove 70 is formed at the upper end portion of the front edge of the side plate 52 in the retainer 50, even if the releasing jig J slips, the place where it possibly falls is limited to the gap S which is provided on the side surface side and in its upper portion. This gap S corresponds to a side of the upper-stage cavities 22, faces only the female terminal 10 at the end of the juxtaposed array of the female terminals 10, and is in a state of being covered by the remaining partition wall 22A between the cavities 22. Therefore, even if the releasing jig J falls, not only a short circuit but contact with the female terminal 10 is prevented.

In addition, the portion where the releasing jig J is rotatively operated and the position where the locking projection 67 is fitted to the locking hole 40 are at substantially diagonal positions. When the releasing jig J is rotatively operated, the retainer 50 acts to rotate about the locked portion or its vicinity, so that the locking projection 67 is easily disengaged from the locking hole 40. For this reason, the operation of returning the retainer 50 from the final retaining position to the temporary retaining position can be effected relatively easily.

The present invention is not limited to the embodiment described in the foregoing and with reference to the drawings, and the following embodiments, for example, are included in the technical scope of the invention. In addition to the following, the invention may be implemented by making various changes or modifications within the scope that does not depart from the gist of the invention.

The jig insertion groove may be provided on a lower portion side of the front edge of the side plate in the retainer. In this case, there is a possibility of the releasing jig falling into the gap in the lower portion on the side surface side. In this gap, however, only the female terminal at the end among the lower-stage female terminals is exposed, so that even if the releasing jig has fallen, it is only one female terminal at the end that comes into contact. Hence, at least the occurrence of a short-circuiting accident can be reliably prevented. Hence, such a configuration is also included in the technical scope of the invention.

Even if the cavities served by the retainer are those of one stage, in a case where the juxtaposed terminal fittings are disposed in such a manner as to be exposed in the gap formed between the retainer and the retainer fitting opening so as to be capable of being contacted from the outside, depending on such as the way in which the partition walls between the cavities are formed, the invention becomes similarly effective by preventing a short circuit caused by the contact of the releasing jig.

The invention is also applicable to a male connector accommodating male terminals.

According to a first aspect of the present invention, there is provided a connector including: a connector housing; a plurality of cavities disposed in the connector housing to be juxtaposed in a widthwise direction; a plurality of terminal fittings each inserted in the cavities respectively from behind of the cavities; a plurality of lances disposed in the cavities respectively and primarily retains the terminal fittings resiliently; a retainer fitting opening formed in an outer surface of the connector housing in communication with each of the cavities; and a retainer having a pair of side plates on both sides of a base portion having retaining portions that retains the terminal fittings, the retainer fitted to the retainer fitting opening in such a manner so as to be capable of advancing and retracting from a diagonally rearward direction while clamping the connector housing in the widthwise direction, wherein the retainer is to be held respectively at a temporary retaining position at which the retaining portion is retracted from the cavity to allow the insertion and withdrawal of the terminal fitting and at a final retaining position at which the retaining portion is advanced in the cavity to doubly retain a corresponding one of the terminal fittings, wherein the connector further comprising a jig insertion portion provided in each of the side plates of the retainer and allows a jig to be inserted therein, wherein the retainer is operatable to return from the final retaining position to the temporary retaining position as the jig is rotated along a planar direction of the side plate.

According to a second aspect of the invention, in addition to the first aspect, the jig insertion portion is provided at a position corresponding to a portion where a partition wall for partitioning adjacent ones of the cavities remains.

According to a third aspect of the invention, in addition to the first aspect, rows of cavities are arranged in a plurality of stages, and wherein the retainer fitting opening is formed with such a depth that the retainer fitting opening communicates with the cavities in each of the stages.

According to a fourth aspect of the invention, in addition to the third aspect, the jig insertion portion is provided in the side plate of the retainer on a deeper side in an advancing and retracting direction.

According to a fifth aspect of the invention, in addition to the fourth aspect, a locking portion for restricting the retraction of the retainer by retaining the connector housing in a case where the retainer is at the final retaining position is provided at a shallow position on the retainer in the advancing and retracting direction.

According to the first aspect, when the retainer is returned to the temporary retaining position, and a gap is created with respect to the retainer fitting opening, on the side plate side of the retainer, only the terminal fitting at the end among the juxtaposed terminal fittings is exposed. For this reason, even if the jig falls into the gap by being displaced from the jig insertion portion, the jig comes into contact with one terminal fitting at the end at most. Hence, the occurrence of a so-called short-circuiting accident between the terminal fittings can be prevented.

According to the second aspect, the jig which has falling into the gap abuts against the partition wall between the cavities, so that contact with the terminal fitting is completely restricted.

According to the third aspect, in a case where rows of cavities are provided in a plurality of stages, particularly in the cavities in a shallow-side stage close to the opening, it is necessary to allow the retaining portions advancing into the cavities in the deeper-side stage to escape. Hence, it is difficult to provide the partition walls. For this reason, there is a high possibility that the terminal fittings inserted in the cavities become practically bare. If the jig falls into the gap formed on the base portion side of the retainer, there is a large risk of a short circuit occurring between the juxtaposed terminal fittings.

In this respect, in the invention, as the jig insertion portion is provided in the side plate of the retainer, the possibility of jig falling is limited to the gap between the side plate of the retainer and the retainer fitting opening. Since only the terminal fitting at the end among the juxtaposed terminal fittings is exposed in this gap, the occurrence of a short-circuiting accident can be prevented.

According to the fourth aspect, in the cavities in the deeper-side stage, there is not much need to take into consideration of the escape of the retaining portions, so that it is possible to leave the partition walls between the cavities. Accordingly, even if the jig falls into the gap, the jig abuts against the partition wall, so that contact with the terminal fitting is completely restricted.

According to the fifth aspect, in a case where the returning operation of the retainer is effected with the jig, the retainer acts to rotate about the locking portion or its vicinity owing to the positional relationship between the jig insertion portion and the locking portion. Hence, the retention of the locking portion is easily canceled. Accordingly, the returning operation of the retainer to the temporary retaining position can be effected easily.

Although the present invention has been shown and described with reference to specific embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A connector comprising:

a connector housing;

a plurality of cavities disposed in the connector housing to be juxtaposed in a widthwise direction;

a plurality of terminal fittings each inserted in the cavities respectively from behind of the cavities;

a plurality of lances disposed in the cavities respectively and primarily retains the terminal fittings resiliently;

a retainer fitting opening formed in an outer surface of the connector housing in communication with each of the cavities; and a retainer having a pair of side plates on both sides of a base portion having retaining portions that retains the terminal fittings, the retainer fitted to the retainer fitting opening in such a manner so as to be capable of advancing and retracting from a diagonally rearward direction while clamping the connector housing in the widthwise direction, wherein the retainer is to be held respectively at a temporary retaining position at which the retaining portion is retracted from the cavity to allow the insertion and withdrawal of the terminal fitting and at a final retaining position at which the retaining portion is advanced in the cavity to doubly retain a corresponding one of the terminal fittings, wherein the connector further comprising a jig insertion portion provided in each of the side plates of the retainer and allows a jig to be inserted therein, the jig insertion portion being provided at a position corresponding to a portion where a partition wall remains for partitioning adjacent ones of the cavities wherein the retainer is operatable to return from the final retaining position to the temporary retaining position as the jig is rotated along a planar direction of the side plate.

2. The connector according to claim 1, wherein rows of cavities are arranged in a plurality of stages, and wherein the retainer fitting opening is formed with such a depth that the retainer fitting opening communicates with the cavities in each of the stages.

3. The connector according to claim 2, wherein the jig insertion portion is provided in the side plate of the retainer on a deeper side in an advancing and retracting direction.

4. The connector according to claim 3, wherein a locking portion for restricting the retraction of the retainer by retaining the connector housing in a case where the retainer is at the final retaining position is provided at a shallow position on the retainer in the advancing and retracting direction.

5. The connector according to claim 1, wherein the jig insertion portion is a groove formed at a leading end of the side plate with respect to the advancing direction of the retainer.

6. The connector according to claim 1, wherein the connector housing has opposite front and rear ends, each of the side plates of the retainer having a front end defining a portion of the side plate closer to the front end of the connector housing, each of the side plates further having a leading end projecting from the base portion of the retainer, the jig insertion portion defining a groove at a portion of the side plate where the front end of the side plate and the leading of the side plate meet.

7. The connector according to claim 6, wherein the jig insertion groove has a bottom edge defining a portion of the jig insertion groove furthest from the leading edge of the side plate, the bottom edge of the jig insertion groove being disposed on a portion of the partition wall for substantially preventing the jig from contacting one of said terminal fittings.

8. The connector according to claim 6, wherein the leading end of the side plate defines a chamfered entry to the jig insertion groove.

9. The connector according to claim 1, wherein the housing has opposite front and rear ends and side walls extending between the ends, the retainer fitting opening being rearward of the front end of the housing, portions of the side walls aligned with the retainer fitting opening in a front to rear direction being recessed relative to portions of the side walls forward of the retainer fitting opening, the jig insertion portion being on parts of the side plates disposed on the recessed portions of the side walls of the housing and immediately rearward of parts of the side walls that are not recessed.

10. The connector according to claim 9, wherein portions of the side walls forward of the retainer fitting opening have a rearwardly facing step for engagement by a jig to pry the retainer rearward and to a retracted position.

* * * * *